(12) United States Patent
Law et al.

(10) Patent No.: US 6,711,904 B1
(45) Date of Patent: Mar. 30, 2004

(54) ACTIVE THERMAL MANAGEMENT OF SEMICONDUCTOR DEVICES

(75) Inventors: Jonathan Michael Law, Earls Barton (GB); Nigel Henry Harley, Hayling Island (GB)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 10/382,450

(22) Filed: Mar. 6, 2003

(51) Int. Cl.[7] .......................... F25B 21/02; F25B 23/12
(52) U.S. Cl. .................. 62/3.2; 62/3.7; 62/259.2
(58) Field of Search .................... 62/3.1–3.7, 259.2

(56) References Cited

U.S. PATENT DOCUMENTS

| | | | |
|---|---|---|---|
| 4,860,744 A | * | 8/1989 | Johnson et al. ............ 606/31 |
| 5,012,325 A | | 4/1991 | Mansuria et al. |
| 5,032,897 A | | 7/1991 | Mansuria et al. |
| 5,367,890 A | * | 11/1994 | Doke .......................... 62/3.7 |
| 6,043,982 A | | 3/2000 | Meissner |
| 6,094,919 A | * | 8/2000 | Bhatia ........................ 62/3.7 |
| 6,196,002 B1 | | 3/2001 | Newman et al. |
| 6,230,497 B1 | * | 5/2001 | Morris et al. ............... 62/3.7 |
| 6,282,907 B1 | | 9/2001 | Ghoshal |
| 6,345,507 B1 | | 2/2002 | Gillen |
| 2002/0191430 A1 | | 12/2002 | Meir |

OTHER PUBLICATIONS

Macris, Heat Dissipating IC Device, Sep. 26, 2002, US PGP 2002/0134419 A1.*

* cited by examiner

*Primary Examiner*—William C. Doerrler
*Assistant Examiner*—Filip Zec
(74) *Attorney, Agent, or Firm*—Frederick J. Telecky, Jr.; W. James Brady, III

(57) ABSTRACT

The present invention facilitates semiconductor cooling by combining a semiconductor die and a thermoelectric cooler into a single, integrated package or system. The thermoelectric cooler is controllably operated so as to dissipate thermal energy generated by the semiconductor die. Active thermal management of the package is performed by a controller, which monitors temperature(s) of the semiconductor die and increases or adjusts cooling such that desired performance levels can be obtained. The invention can also thermally manage one or more regions of a semiconductor die and can thermally manage a plurality of semiconductor dies.

23 Claims, 13 Drawing Sheets

ACTIVE THERMAL MANAGEMENT OF SEMICONDUCTOR DEVICES

FIELD OF THE INVENTION

The present invention relates generally to the field of semiconductor devices, and more particularly, to active thermal management of semiconductor devices utilizing thermal electric coolers.

BACKGROUND OF THE INVENTION

Semiconductor devices, whether digital or analog, comprise a variety of circuit components. Just about all of these components generate heat or thermal energy during operation but have their performance degraded by excessive heat. The heat generated by these components is a function of the performance, which includes frequency, power levels, speed of data transfer and the like, at which the devices are operated. While modifications to devices and components can reduce heat generation, increases in performance generally cause increases in heat generation. Consequently, failure to control or dissipate heat adequately can limit performance, or indeed damage the component or limit its life expectancy.

As time goes on, the demand for performance increases. Therefore, semiconductor devices are increasingly required to operate at faster speeds, transfer more data, have a better signal to noise ratio, fit in a smaller area (scale) and the like. Thus, generation of thermal energy by these devices continues to increase. Further, more components are squeezed into ever smaller die areas further increasing heat generation and concentration, that can also affect performance and life expectancy.

Thermal energy can be controlled, thereby facilitating performance, by employing semiconductor cooling techniques. One common technique for managing heat generated by semiconductor devices is to utilize a heatsink. The heatsink is a thermally conductive device that is operable to draw heat from a semiconductor device and dissipate it in the air. Generally, a solid portion of the heatsink is on or near the semiconductor device and fans or blades are on an opposite edge of the heatsink. The blades facilitate dissipation of thermal energy from the heatsink to ambient air.

Another common technique for managing heat generated by semiconductor devices is to employ a cooling fan with a heatsink. The cooling fan is typically mounted on or near blades of the heatsink and facilitates dissipation by blowing air away from or towards the blades.

Another technique for managing heat generated by semiconductor devices is to employ a solid state cooling device called a thermoelectric cooler (TEC). The thermoelectric cooler relies on the Peltier effect, in which a voltage applied to the junction of two dissimilar metals creates a temperature difference between the two metals. This temperature differential can be used for cooling or heating. Thermoelectric coolers are semiconductor devices in and of themselves. They are fabricated from two elements of semiconductor, primarily Bismuth Telluride. The semiconductor is heavily doped to create an n-type region and a p-type region. The junction between the n-type region and the p-type region is a semiconductor thermocouple. At a cold side of the thermoelectric cooler, thermal energy is absorbed by electrons as they pass from a low energy level in the p-type region to a higher energy level in the n-type region. A power supply provides the energy to move electrons through the system. At a hot side, energy is expelled to a heatsink as electrons move from a high energy level in the n-type region to a lower energy level in the p-type region. Heat absorbed at the cold side is pumped to the hot side at a rate proportional to current passing through the circuit.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

The present invention facilitates semiconductor cooling by combining a semiconductor die and a thermoelectric cooler into a single, integrated package or system. The thermoelectric cooler is controllably operated so as to dissipate thermal energy generated by the semiconductor die. Active thermal management of the package is performed by a controller, which monitors temperature(s) of the semiconductor die and increases or adjusts cooling such that desired performance levels can be obtained.

The present invention facilitates semiconductor device operation by actively maintaining device temperatures according to desired performance levels. The invention integrates a semiconductor die, a thermoelectric cooler, and active thermal management into a single package so as to actively manage the die temperature. Because of this integration, cooling of the semiconductor die can be improved as compared with conventional cooling systems. Additionally, this thermal management can maintain temperatures that permit desired performance levels (e.g., a relatively high frequency) of operation. A controller, located internal or external to the package, performs temperature measurement and thermoelectric cooler control. The controller can, in some variations, be located on the semiconductor die. Additionally, the present invention can independently thermally manage one or more regions of a semiconductor die and can independently thermally manage a plurality of semiconductor dies.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

The present invention will now be described with respect to the accompanying drawings in which like numbered elements represent like parts. The figures provided herewith and the accompanying description of the figures are merely provided for illustrative purposes. One of ordinary skill in the art should realize, based on the instant description, other implementations and methods for fabricating the devices and structures illustrated in the figures and in the following description.

The present invention facilitates semiconductor cooling by combining a semiconductor die and a thermoelectric cooler into a single, integrated package or system. The thermoelectric cooler is controllably operated so as to dissipate thermal energy generated by the semiconductor die. Active thermal management of the package is performed by a controller, which monitors temperature(s) of the semiconductor die and increases or adjusts cooling such that desired performance levels can be obtained.

Figure 1:
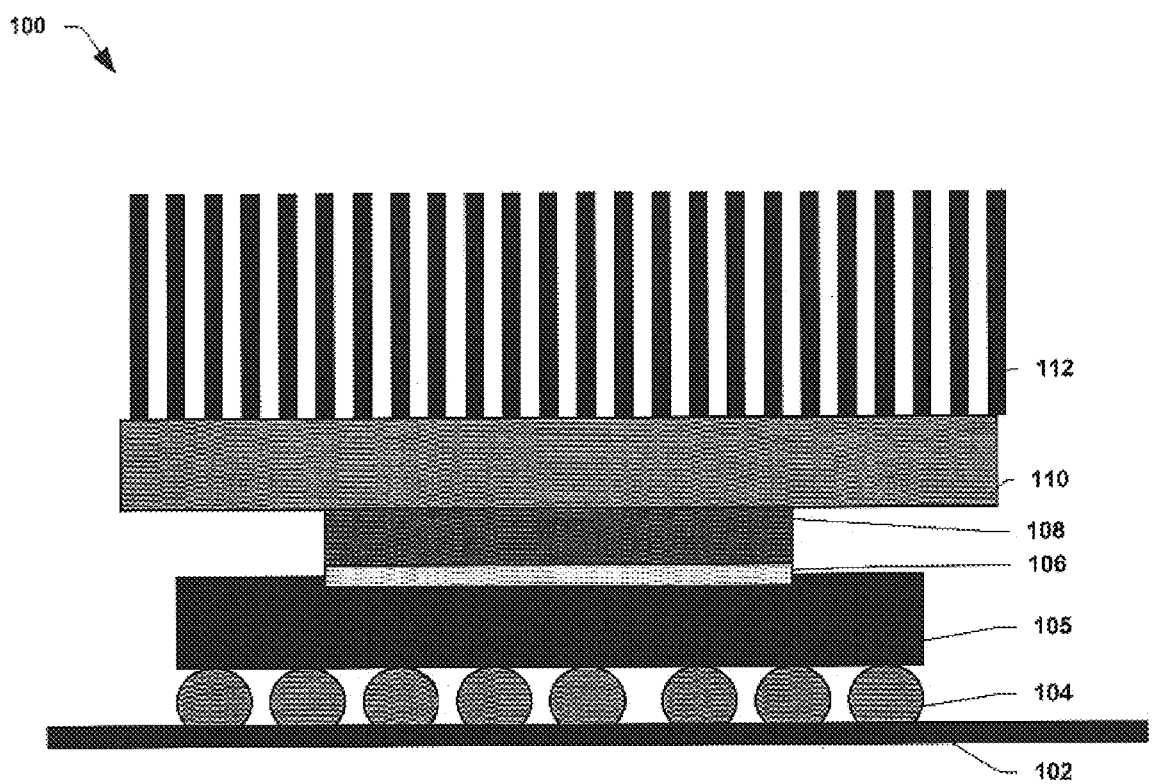
FIG. 1 is a diagram illustrating an integrated cooler package in accordance with an aspect of the present invention.

FIG. 1 illustrates an integrated cooler package 100 in accordance with an aspect of the present invention. The package 100 is operable to manage thermal dissipation and thereby control operational temperatures. Additionally, the package 100 is operable to maintain a desired temperature required to meet performance needs.

The package 100 is shown mounted on a circuit board 102. The circuit board 102 has a number of connections such as voltage lines, ground connections, logic connections, clocks, and the like. The circuit board 102 has a number of contact regions (not shown) that connect with a number of balls 104 of the package 100. The balls 104 include signal balls, thermal balls, power balls and the like and provide thermal and signal connections to the circuit board. The signal balls permit external communication with the package, the thermal balls provide external thermal information and control, and the power balls provide power to semiconductor devices and cooling devices within the package 100.

A package substrate 105 is located on the balls 104. Generally, the balls 104 are formed or mounted on the semiconductor die 106 therein providing external connections to devices and components formed in and/or on the die 106. A semiconductor die 106 is located or formed on and/or within the package substrate 105 and includes one or more semiconductor devices (not shown). The devices can include analog and/or digital circuits such as, digital to analog/analog to digital/analog to digital converters, computer processor units, amplifiers, digital signal processors, controllers, and the like. In operation, the semiconductor die 106 generates thermal energy (heat). Connections between the semiconductor die 106 and the balls 104 are present within the package substrate 105.

A thermoelectric cooler (TEC) 108 is mounted on and in thermal contact with the semiconductor die 106. A thermal paste can be employed between the die 106 and the thermoelectric cooler 108 to enhance thermal conductivity therebetween. While the cooler 108 is illustrated as being smaller than the die 106, the thermoelectric cooler can also be about the same size or larger than the die and still be in accordance with the present invention. The thermoelectric cooler 108, also referred to as a thermoelectric module or Peltier device, is a semiconductor based electronic component that functions as a small heat pump. When a DC voltage, typically a low voltage, is applied to the thermoelectric cooler 108, thermal energy is dissipated and moved from a bottom side (cooling side) that is in contact with the semiconductor die 106 to a top side of the thermoelectric cooler 108. Additionally, some of the balls 104 described above are power balls that provide separate power to the thermoelectric cooler 108. A further description of thermoelectric cooler operation and structure is described infra.

A heatsink 110, comprising a thermally conductive material, is formed on the thermoelectric cooler 108. The heatsink 110, because of its thermal conductivity, draws thermal energy away from the thermoelectric cooler 108. A number of suitable thermally conductive materials, such as aluminum, copper, and the like, can be employed for the heatsink 110. The heatsink 110 further comprises a plurality of blades 112 or fins, also comprised of a thermally conductive material. The blades 112 include air gaps therebetween that facilitate dissipation of thermal energy to ambient air. The blades 112 can be of varied lengths and numbers and still be in accordance with the present invention. Additionally, the blades 112 can be replaced with pins of a suitable shape (e.g., round, elliptical, and the like) and still be in accordance with the present invention.

Although not shown, a separate cooling system (e.g., fan based, liquid cooling, thermoelectric, and the like) can be mounted on top of the blades 112 or near the blades 112 in order to dissipate thermal energy from the heatsink 110. One suitable exemplary system employs a cooling fan can be mounted on top of the blades 112 or near the blades on the board 102 to further facilitate dissipation of thermal energy. The cooling fan blows air on or away from the blades 112 with a particular rotations per minute, which can be adjusted as necessary. Another suitable exemplary system is a liquid cooling system in which a coolant (e.g., water, oil, and the like) is moves through an interior of the heatsink 110 (e.g., via heatpipes). The coolant absorbs thermal energy from the heatsink which is subsequently dissipated. An evaporator and condensor can be utilized to move the coolant.

The thermoelectric cooler 108 is operated and controlled so as to maintain a temperature of the semiconductor die 106 at or below a target temperature by controlling the amount of voltage applied across the thermoelectric cooler 108. The target temperature of the die 106 is correlated generally inversely to a desired performance level. Thus, if high performance is desired, the die 106 should be maintained at a low temperature. Consequently, if only low performance is desired, the die 106 can be maintained at a higher temperature. The thermoelectric cooler 108 can be controlled external to the package 100 by an external controller or digital signal processor. Additionally, the thermoelectric cooler 108 can be controlled internal to the package 100 by a controller or digital signal processor built into/onto the semiconductor die 106.

Figure 2:
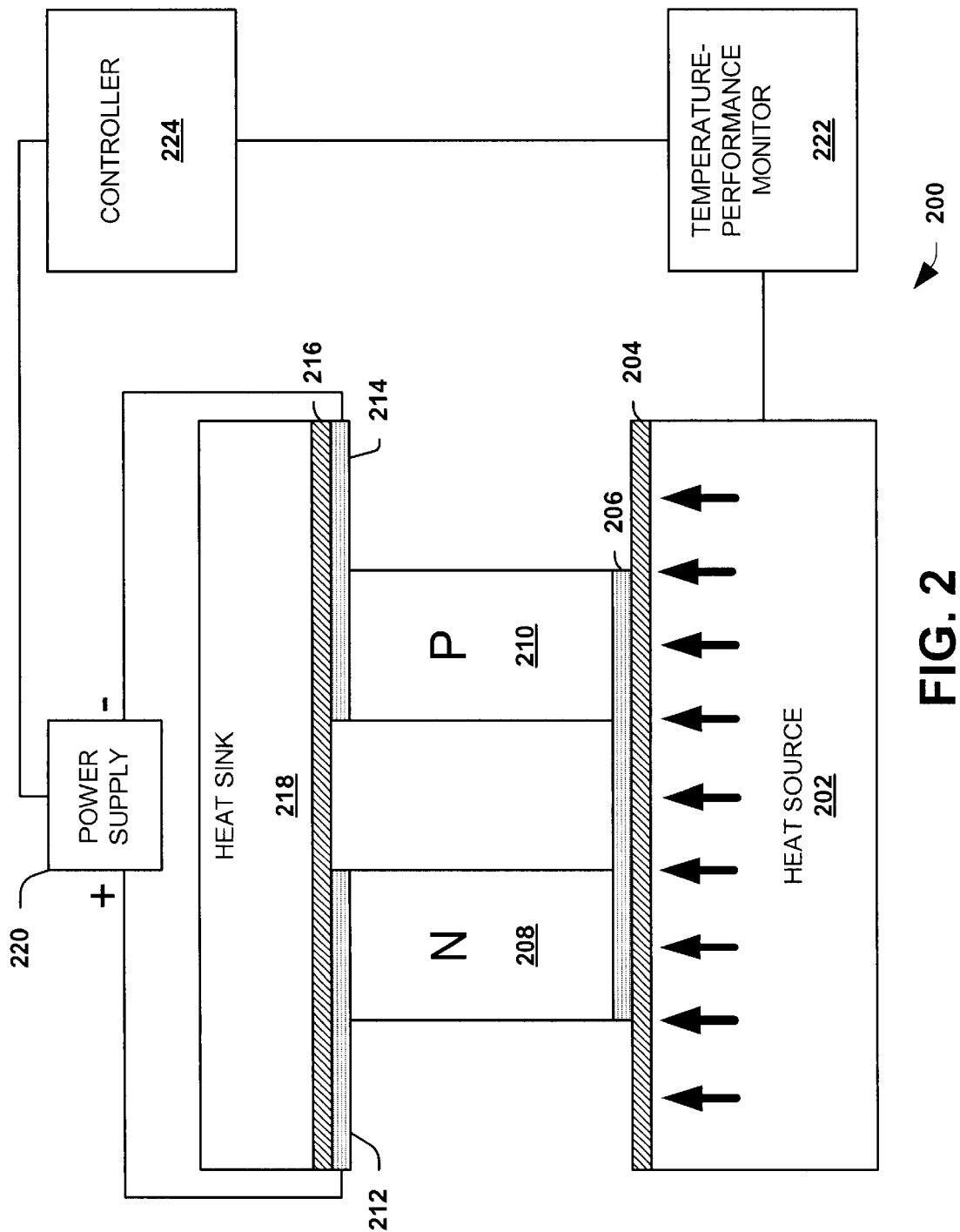
FIG. 2 is a block diagram illustrating a thermoelectric cooler in accordance with an aspect of the present invention.

Continuing with FIG. 2, a block diagram of a thermoelectric cooler 200 in accordance with the present invention is depicted. The thermoelectric illustrated cooler 200 is a single stage or single unit cooler that can be combined with other coolers in serial and/or in parallel to provide desired amounts of cooling. It is appreciated that the thermoelectric cooler 200 can be employed for cooling and heating, however, for semiconductor device cooling it is generally operated in a cooling mode.

A heat source 202, such as a semiconductor die, generates thermal energy. The heat source 202 can be a processor, digital to analog/analog to digital converters, amplifiers, digital signal processors, controllers, another thermoelectric cooler unit, and the like. A first thermally conductive layer 204 is formed on the heat source 202. The first thermally conductive layer 204 is thermally conductive but electrically insulative and is comprised of a suitable material, such as a ceramic. A first conductive layer 206 is formed on at least a portion of the first thermally conductive layer. The first conductive layer 206 is electrically and thermally conductive and is comprised of a suitable conductive material such as aluminum or copper.

An n-type region 208 and a p-type region 210 are formed on the first conductive layer 206 so as not to be in physical contact with each other. The n-type region 208 and the p-type region 210 are comprised of a suitable semiconductor material such as bismuth-telluride. Additionally, the n-type region 208 is doped with an n-type dopant and the p-type region 210 is doped with a p-type dopant, thereby creating the n-type and p-type regions with excess electrons and holes, respectively. An n-type contact region 212 is formed on the n-type region 208. The n-type contact region 212 is electrically and thermally conductive. Similarly, a p-type contact region 214 is formed on the p-type region 210, and is also electrically and thermally conductive. The regions 212 and 214 are not electrically connected.

A second thermally conductive layer 216 is formed on at least a portion of the n-type contact region 212 and the p-type contact region 214. The second thermally conductive layer 216 is electrically insulative. Also, the second thermally conductive layer 216 is comprised of a suitable material such as a ceramic. A heatsink 218 is located on the second thermally conductive layer 216 and operates to dissipate thermal energy into ambient air. The heatsink 218 typically includes blades or fans to facilitate dissipation of the thermal energy.

A power supply 220 generates a voltage potential that is applied across the n-type region 208 and the p-type region 210. A positive terminal of the power supply 220 is electrically connected to the n-type contact region 212 and a negative terminal of the power supply 220 is electrically connected to the p-type contact region 214, thus applying the voltage potential across the n-type region 208 and the p-type region 210. The positive potential applied to the n-type region 208 causes electrons to pass from the p-type region 210 to the n-type region 208, wherein the electrons move from a higher energy state to a lower energy state thereby absorbing thermal energy from the heat source 202. Because of this phenomenon, thermal energy is generated at or near the n-type contact region 212 and the p-type contact region 214. This thermal energy is dissipated by the heat sink 218.

A temperature monitor 222 periodically or continuously monitors a temperature of the heat source 202. The temperature monitor 222 can monitor a temperature at one or more regions of the heat source 202. A controller 224 receives temperature information from the temperature monitor and determines how much cooling to be performed by the thermoelectric cooler 200. The controller 224 factors in a desired or target performance into the cooling determination and controls the power supply 220 so as to appropriately control the voltage potential applied thereby controlling cooling by the thermoelectric cooler 200.

Figure 3:
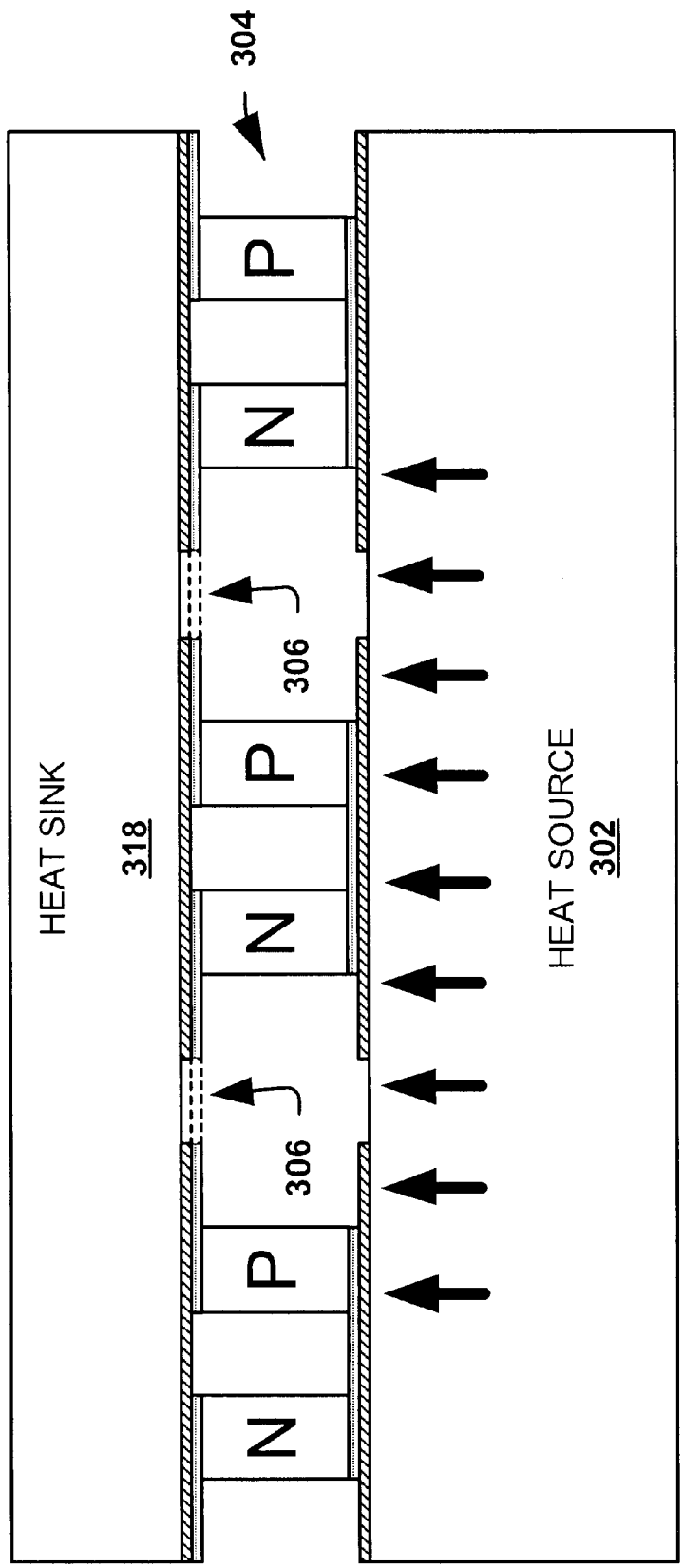
FIG. 3 is a block diagram illustrating a thermoelectric cooler system in accordance with an aspect of the present invention.

FIG. 3 is a block diagram that illustrates a thermoelectric cooler system 300 in accordance with another aspect of the present invention. The system 300 includes three thermoelectric units 304. In one example, the various units are coupled in parallel to provide the cooling at each location, and in another example the multiple units are independently coupled to their own supply so that the system can facilitate cooling regions independently.

A heat source 302, such as a semiconductor die, generates thermal energy. The heat source 302 can be a processor, digital to analog/analog to digital converters, amplifiers, digital signal processors, controllers, and the like. The three thermoelectric units 304 are located on the heat source 302 and facilitate dissipation of thermal energy from the heat source 302. Individually, the units 304 are substantially comprised as described supra with respect to FIG. 2. Distinct, controlled voltage potentials can be applied across each of the units 304. Alternately, a single voltage potential can be applied across all of the units 304, wherein intermediary n-type and p-type regions 306 are electrically connected. A heatsink 318 is located on the thermoelectric units 304. The heatsink 318 draws thermal energy from the thermoelectric units 304 and dissipates the thermal energy to ambient air.

Figure 4:
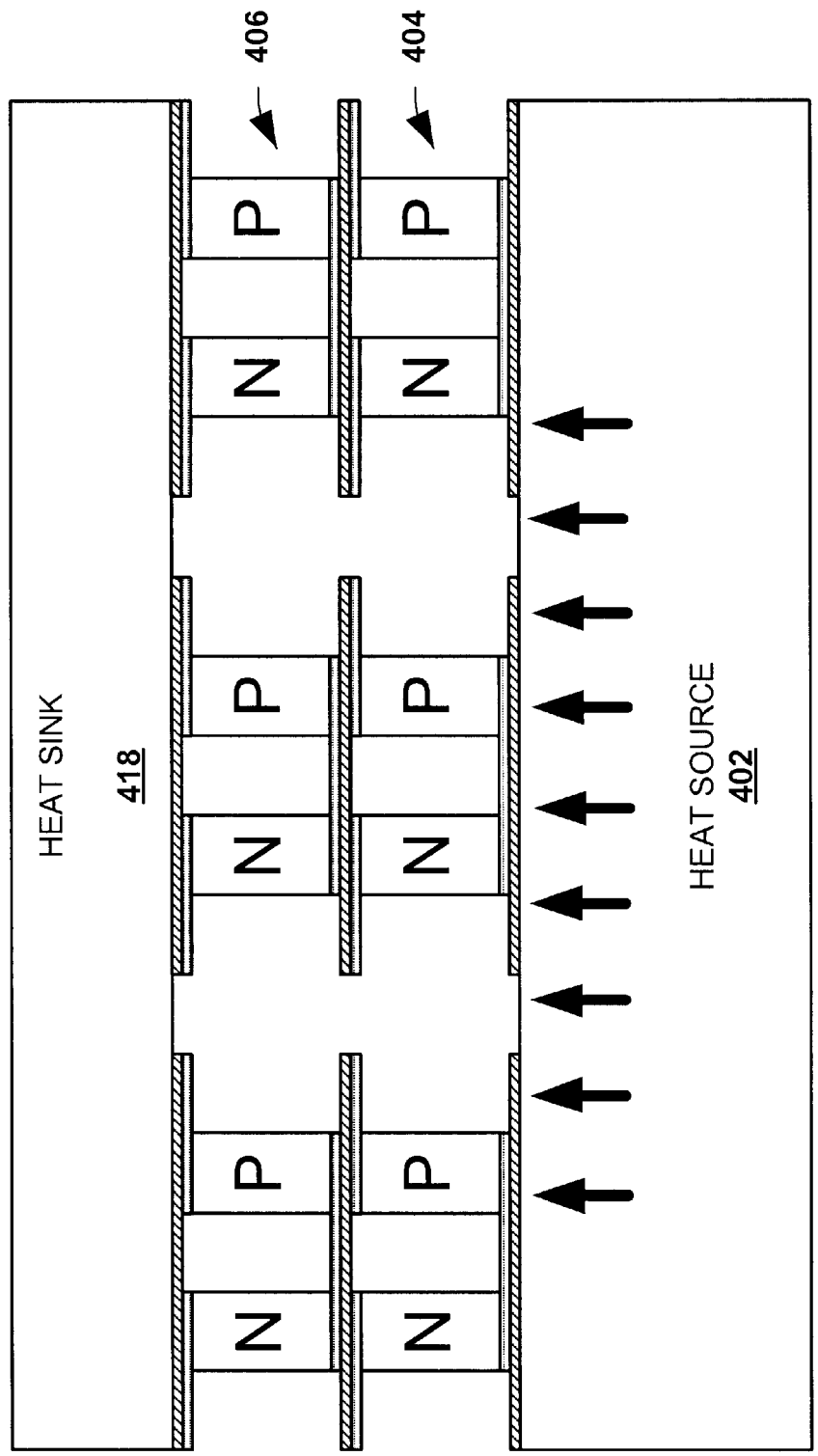
FIG. 4 is a block diagram illustrating a thermoelectric cooler system in accordance with an aspect of the present invention.

Turning now to FIG. 4, a block diagram illustrating a thermoelectric cooler system 400 in accordance with an aspect of the present invention is depicted. The system 400 includes a first set of three thermoelectric units 404 and a second set of three thermoelectric units 406. The units 404 and 406 are configured in series and in parallel. By having multiple units, the system can facilitate cooling regions independently.

A heat source 402, such as a semiconductor die, generates thermal energy. The heat source 402 can be a processor, digital to analog/analog to digital converters, amplifiers, digital signal processors, controllers, and the like. The thermoelectric units 404 and 406 are located on/over the heat source 402 and facilitate dissipation of thermal energy from the heat source 402. Individually, the units 404 and 406 are substantially comprised as described supra with respect to FIG. 2. Distinct, controlled voltage potentials can be applied across each of the units 404 and 406. Alternately, a single voltage potential can be applied across all of the units 404 and 406. A heatsink 418 is located on the thermoelectric units 406, which draws thermal energy from the thermoelectric units 406 and dissipates to ambient air.

It is appreciated that variations of the thermoelectric cooler systems described supra are contemplated in accordance with the present invention. The systems described in FIGS. 2–4 are only a few examples of configurations of thermoelectric cooler systems in accordance with the present invention. Different materials and configurations of the various components and structures can be employed in accordance with the present invention, so long as thermoelectric cooler properties remain.

Figure 5:
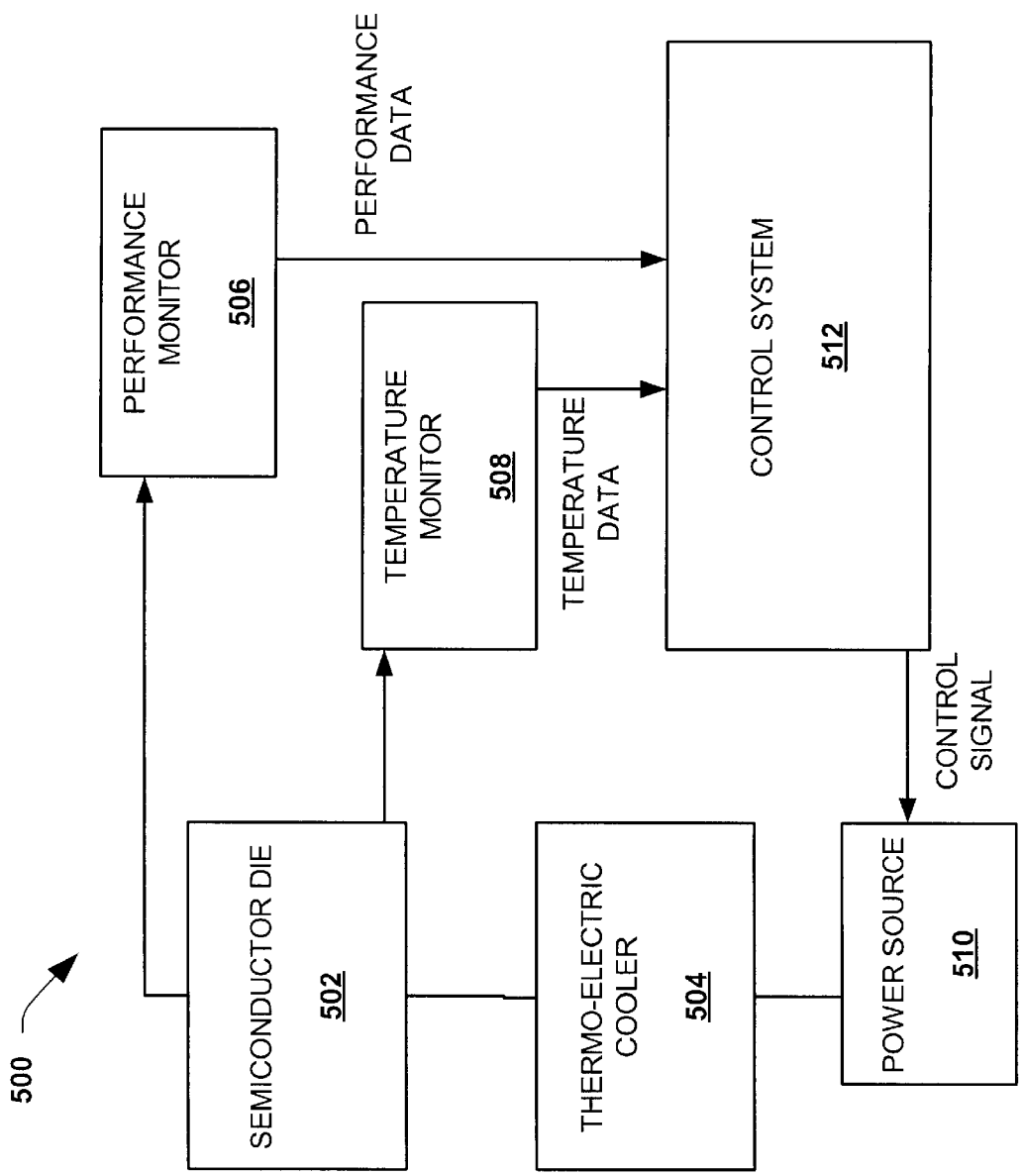
FIG. 5 is a block diagram illustrating an integrated thermoelectric cooler system in accordance with an aspect of the present invention.

FIG. 5 is a block diagram illustrating an integrated thermoelectric cooler system 500 in accordance with an aspect of the present invention. The system 500 includes a semiconductor die 502, a thermoelectric cooler 504, a performance monitor 506, a temperature monitor 508, a power supply 510, and a control system 512. The system 500 is formed as an integrated package with a suitable number of connections to external devices and boards. The system 500 is self contained in that temperature can be maintained, adjusted, and controlled during operation of the system.

The semiconductor die 502 is one component of the system 500. The semiconductor die 502 includes one or more semiconductor devices (not shown). The devices can include analog and/or digital circuits such as, digital to analog/analog to digital converters, computer processor units, amplifiers, digital signal processors, controllers, and the like. In operation, the semiconductor die 502 generates thermal energy (heat). Performance of devices on the die 502 is affected by temperature; generally, an increase in temperature degrades performance. Accordingly, the semiconductor die 502 has a normal operation temperature range in which devices are expected to function substantially properly. Additionally, the semiconductor die 502 has one or more high performance temperature ranges that are lower than the normal operation temperature range. Similarly, the semiconductor die 502 may have one or more low performance temperature ranges that are higher than the normal operation temperature range.

A thermoelectric cooler 504 controllably provides cooling to the semiconductor die 502. The cooler 504 is operable to provide cooling to one or more regions, at least partially independently, of the semiconductor die 502. Additionally, the cooler 504 is comprised of one or more individual thermoelectric cooler units, such as described supra. A performance monitor 506 measures and can maintain performance characteristics of the semiconductor die 502 as well as the devices on the semiconductor die 502. These performance characteristics can include data transfer rates, processor frequency, data conversion rates, and the like. A temperature monitor 508 measures and can maintain temperature data of the semiconductor die 502. The temperature data includes temperature readings from one or more regions of the semiconductor die 502. A power source 510 provides and maintains one or more voltages to the thermoelectric cooler 504. The power source 510 is controllable and adjustable to provide the one or more voltages as selectable potentials.

The control system 512 receives and analyzes the performance data from the performance monitor 506 and the temperature data from the temperature monitor 508. Based on the performance data, the control system 512 determines an acceptable range of temperatures that correspond to the performance data. For example, if normal or standard performance is requested, the acceptable range of temperatures for the semiconductor die is the normal operation temperature range, described above. As another example, if high performance is desired, the acceptable range of temperatures is generally lower than that of normal operation. Similarly, if low performance is determined, the acceptable range of temperatures is generally higher than that of normal operation, which can save on power employed to perform the thermoelectric cooling.

Once the acceptable range of temperatures are determined, the control system 512 computes adjustments, if any, to voltage potentials applied to the one or more regions of the thermoelectric cooler 504. Control signal(s) are then sent to the power supply 510 to implement the adjustments in voltage potentials applied to the cooler 504.

Figure 6:
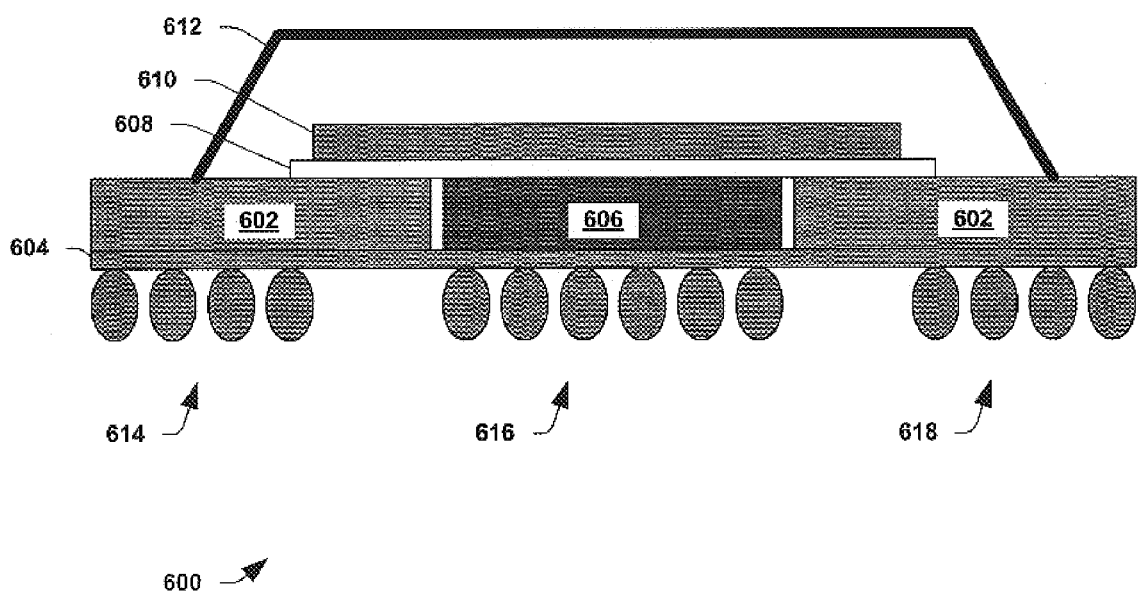
FIG. 6 is a diagram illustrating an integrated cooler package in accordance with an aspect of the present invention.

FIG. 6 is a diagram illustrating an integrated cooler package 600 in accordance with yet another aspect of the present invention. The package 600 is self contained in that it is operable to self regulate temperature as a function of performance. The package 600 is a "cavity up" type configuration and can be feasibly connected to a circuit board.

A lower substrate 604 has a number of balls attached on a bottom side. The balls include thermoelectric cooler balls 616, thermal balls 614, and signal balls 618. The locations of the balls can vary and still be in accordance with the present invention. Additionally, other types of balls, such as die power balls, can be present and attached to the bottom side of the lower substrate 604 and still be in accordance with the present invention.

A thermoelectric cooler 606 is mounted (e.g., centrally) on the lower substrate 604. The cooler 606 includes one or more separately controllable cooling regions. Additionally, the cooler 606 is comprised of one or more individual thermoelectric cooler units, such as described supra. An upper substrate layer 602 is formed on both sides of the thermoelectric cooler 606.

A layer of thermal paste 608 is formed on the thermoelectric cooler 606 and at least a portion of the upper substrate 602. The thermal paste 608 has adhesive characteristics, is a thermal conductor, and is electrically insulative. A semiconductor die 610 is located in contact with the thermal paste 608, which adheres the die 610 to the thermoelectric cooler 606. The semiconductor die 610 includes one or more semiconductor devices (not shown). The devices can include analog and/or digital circuits such as, digital to analog/analog to digital converters, computer processor units, amplifiers, digital signal processors, controllers, and the like. In operation, the semiconductor die 610 generates thermal energy (heat).

Performance of devices on the die 610 is affected by temperature, and, accordingly, an increase in temperature degrades performance. The die 602 can include monitoring components and a controller to facilitate regulation of temperature and performance. A lid 612 comprised of a suitable packaging material is formed on and over the die 602 to protect the semiconductor die 602 from damage and/or contamination. The material employed for the lid is electrically insulative and structurally protective. Thermal and electrical connections (not shown) are present in the lower substrate 604 and the upper substrate 602 so as to provide the necessary power, signal, and thermal connections to the thermoelectric cooler 606 and the semiconductor die 602.

Figure 7:
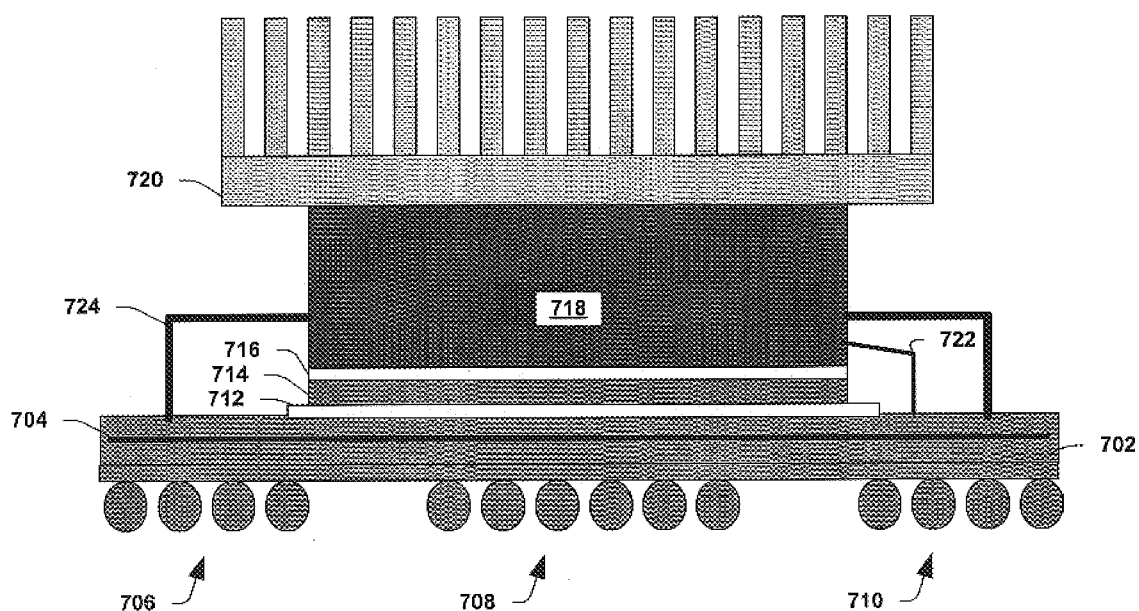
FIG. 7 is a diagram illustrating an integrated cooler package in accordance with an aspect of the present invention.

Continuing on with FIG. 7, another diagram illustrating an integrated cooler package 700 in accordance with an aspect of the present invention is depicted. The package 700 is self contained in that it is operable to self regulate temperature as a function of performance. The package 700 is a "flip chip" type configuration and can be feasibly-connected to a circuit board as part of an electronic system.

A flip chip substrate 702 is provided with a thermoelectric power plane 704 across its length. A die power plane (not shown) can also be present within the substrate 702 to provide power to semiconductor devices. The flip chip substrate 702 is comprised of a suitable material. A variety of balls, including thermoelectric power balls 706, thermal balls 708, and signal balls 710 are mounted on a bottom side of the flip chip substrate 702 so as to provide electrical and thermal connections to a circuit board (not shown) on which the package 700 can be installed.

An underfill layer 712 is formed on at least a portion of the flip chip substrate 702. This layer 712 is electrically insulative. A semiconductor die 714 is located on the underfill layer 712, and includes one or more semiconductor devices (not shown). The devices can include analog and/or digital circuits such as, digital to analog/analog to digital converters, computer processor units, amplifiers, digital signal processors, controllers, and the like. In operation, the semiconductor die 714 typically generates thermal energy (heat). Performance of devices on the die 714 is affected by temperature, and, accordingly, an increase in temperature degrades performance. The die 714 can include monitoring components and a controller to facilitate regulation of temperature and performance.

A layer of thermal paste 716 is formed on the semiconductor die 714. The thermal paste 716 has adhesive characteristics, is a thermal conductor, and is electrically insulative. A thermoelectric cooler 718 is mounted on the thermal paste 716 and thereby adhered to the semiconductor die 714. The cooler 718 includes one or more separately controllable cooling regions. Additionally, the cooler 718 is comprised of one or more individual thermoelectric cooler units, such as described supra. A heatsink 720 is mounted on top of the thermoelectric cooler 718 in order to draw thermal energy out of the thermoelectric cooler 718 and the package 700. The heatsink 720 includes a plurality of blades that facilitate dissipation of thermal energy to ambient air. Additionally, although not a suitable cooling system (e.g., fan based, thermoelectric, liquid cooling, and the like) can be mounted on top of the heat sink to further facilitate dissipation of thermal energy.

Electrical and thermal connections (not shown) are located within the flip chip substrate 702 to provide the necessary connections to the semiconductor die 714 and the thermoelectric cooler 718. A power supply line 722 connects to the thermoelectric power plane 704 to obtain power for the thermoelectric cooler 718. An underfill lid 724 is formed on a portion of the flip chip substrate 704 so as to encapsulate the semiconductor die 714 and at least a portion of the thermoelectric cooler 718.

Figure 8:
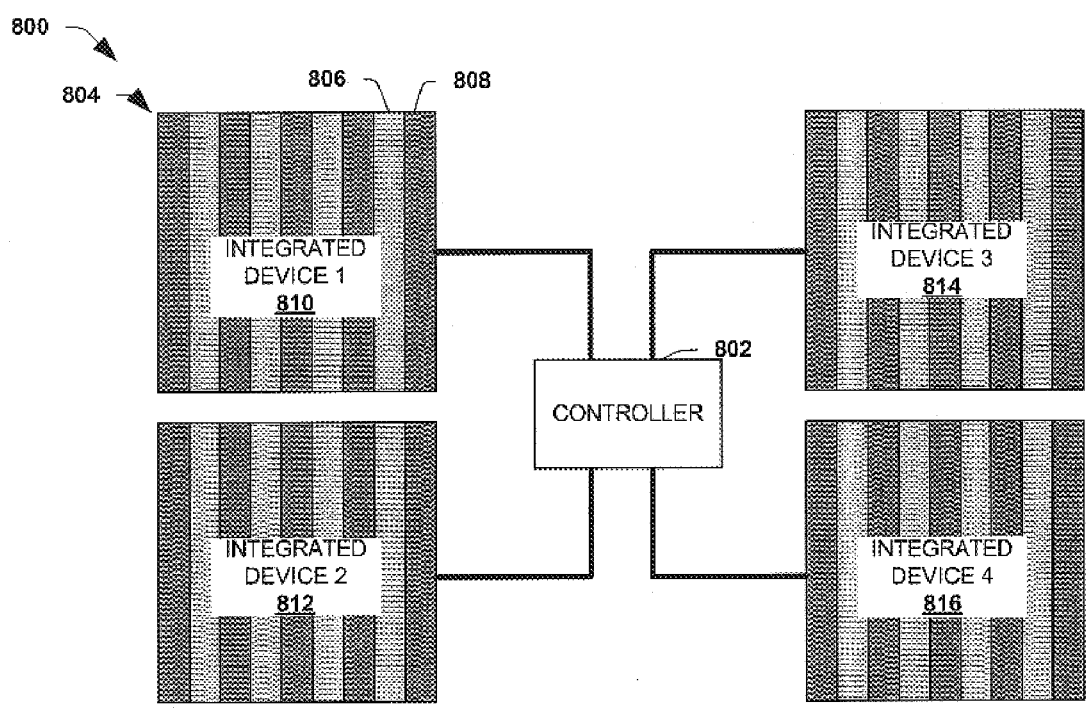
FIG. 8 is a plan view of a system including a plurality of integrated cooler packages in accordance with an aspect of the present invention.

FIG. 8 is a plan view depicting a system 800 including a plurality of integrated cooler packages in accordance with an aspect of the present invention. The integrated cooler packages 804 can be one of the integrated cooler packages described above and variations thereof and minimally comprise a semiconductor die and a thermoelectric cooler. Fan blades 808 and recesses 806 of heatsinks are shown in this view.

A single controller 802 is operable to control the cooling of the integrated devices; integrated device one 810, integrated device two 812, integrated device three 814, and integrated device four 816, as a function of performance. Each of the packages 804 is controlled independently and can be set to differing acceptable temperature ranges.

The controller 802 determines or obtains acceptable temperature ranges for each device according to desired performance levels. It is appreciated that the devices can be varied (e.g., a processor, a digital to analog/analog to digital converter, an amplifier), can be identical (e.g., all being a processor in a multi-processor environment), or a combination thereof. Additionally, there can be varied desired performance levels for the devices (e.g., integrated device one 810 can have a relatively high desired performance level whereas integrated device four 816 can have a relatively low desired performance level). Consequently, the devices can have varied acceptable temperature ranges.

During operation, the controller 802 obtains one or more temperature measurements from each of the devices. The measurements are compared with the acceptable temperature ranges to determine cooling adjustments, which are sent to thermoelectric coolers within the packages 804, wherein the thermoelectric coolers perform the requested cooling adjustments (e.g., generally by modified applied voltages across the coolers). It is appreciated that during operation, the desired performance levels can be adjusted dynamically. In response to altered performance levels, the controller 802 updates acceptable temperature ranges.

It is appreciated that FIG. 8 is merely one example of controlled cooling of multiple integrated packages and devices in accordance with the present invention. The present invention is not limited to a specific number of packages and/or devices and can, therefore, include any suitable number of devices or packages.

Figure 9:
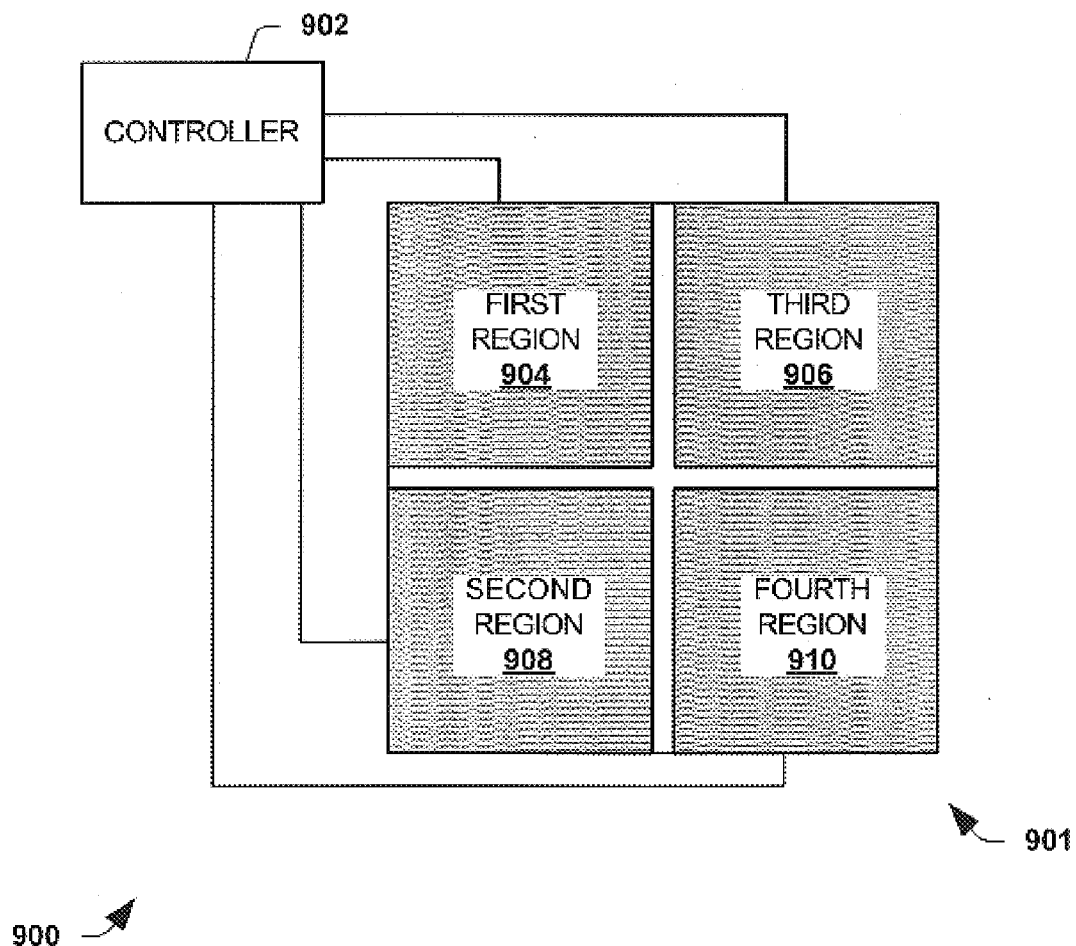
FIG. 9 is a plan view of a system that controls cooling multiple regions of a package in accordance with an aspect of the present invention.

FIG. 9 is a plan view illustrating a system 900 that controls cooling multiple regions of an integrated cooler package in accordance with an aspect of the present invention. The system 900, or package, includes a single die 901, a controller 902, a thermoelectric cooler (not shown), and temperature measurement devices (not shown). The controller 902 can be mounted and/or integrated within the system or package, such as by being formed on the die 901. Alternately, the controller 902 can exist external to the system 900 and can communicate with the various devices and components by various signal and power lines (not shown).

The system 900 is divided into a first region 904, a second region 906, a third region 908, and a fourth region 910, which correspond to regions of the die 901 and the thermoelectric cooler. Each region has one or more temperature devices (e.g., thermocouple, semiconductor thermocouple, thermal sense circuit, and the like).

It is appreciated that semiconductor dies can have some areas or regions that generate more thermal energy and thus require more cooling than other regions. Accordingly, the regions of the system 900 can generate disparate amounts of thermal energy. The controller 902 is operable to measure temperatures from each region and perform cooling individually for each region. Additionally, it is appreciated that one or more of the regions can have varied desired performance levels than the rest. The controller 902 also considers desired performance for each region in performing appropriate cooling.

Figure 10:
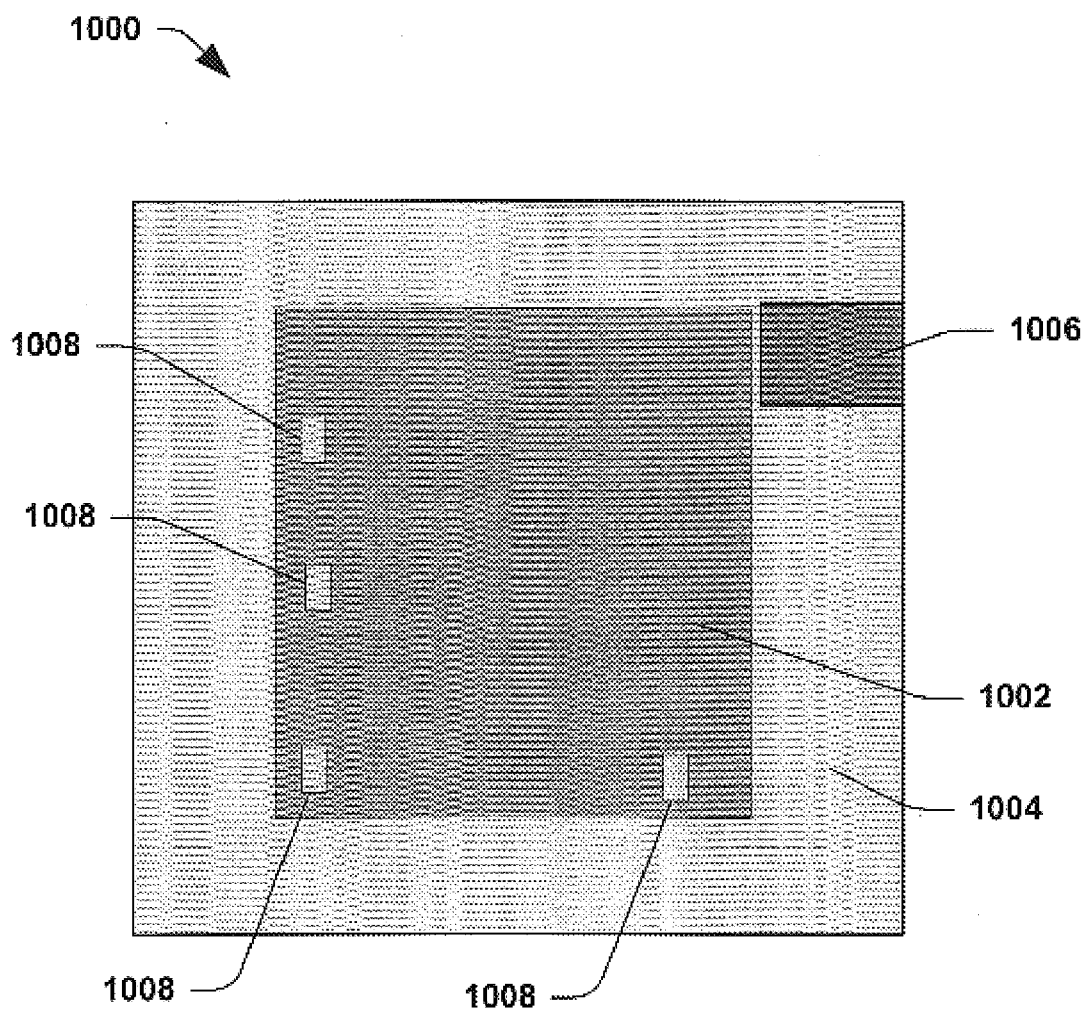
FIG. 10 is a plan view of a semiconductor die wherein a temperature control system is formed in a periphery region.

Continuing on with FIG. 10, a plan view of a semiconductor die 1000 in accordance with an aspect of the present invention is illustrated. The semiconductor die 1000 includes a core region 1002 and a periphery region 1004, for example, as may exist in some types of memory devices.

A temperature control system 1006 (e.g., controller) is shown formed in the periphery region 1004. However, alternate aspects of the present invention can include formation of the temperature control system in other suitable regions of the die 1000, such as within the core region or the core itself (e.g., in the case of a microprocessor, digital signal processor, or the like). The control system 1006 can preclude the requirement of an externally controller for the package. One or more temperature measurement devices (e.g., thermocouple, semiconductor thermocouple, thermal sense circuit, and the like) 1008 can also be formed on the die 1000 to measure temperatures. By being formed on the die 1000, the temperature control system 1006 is integrated into the package or system. A thermoelectric cooler (not shown) with one or more units or stages is mounted to the die 1000 and controlled by the temperature control system 1006.

The temperature control system 1006 determines or obtains acceptable temperature ranges for one or more semiconductor devices formed on the die 1000 according to desired performance levels. Based on these ranges and temperature measurements, the temperature control system 1006 adjusts potentials applied across units of the thermoelectric cooler therein maintaining temperatures of the die 1000 at appropriate levels and permitting desired performance levels.

Figure 11:
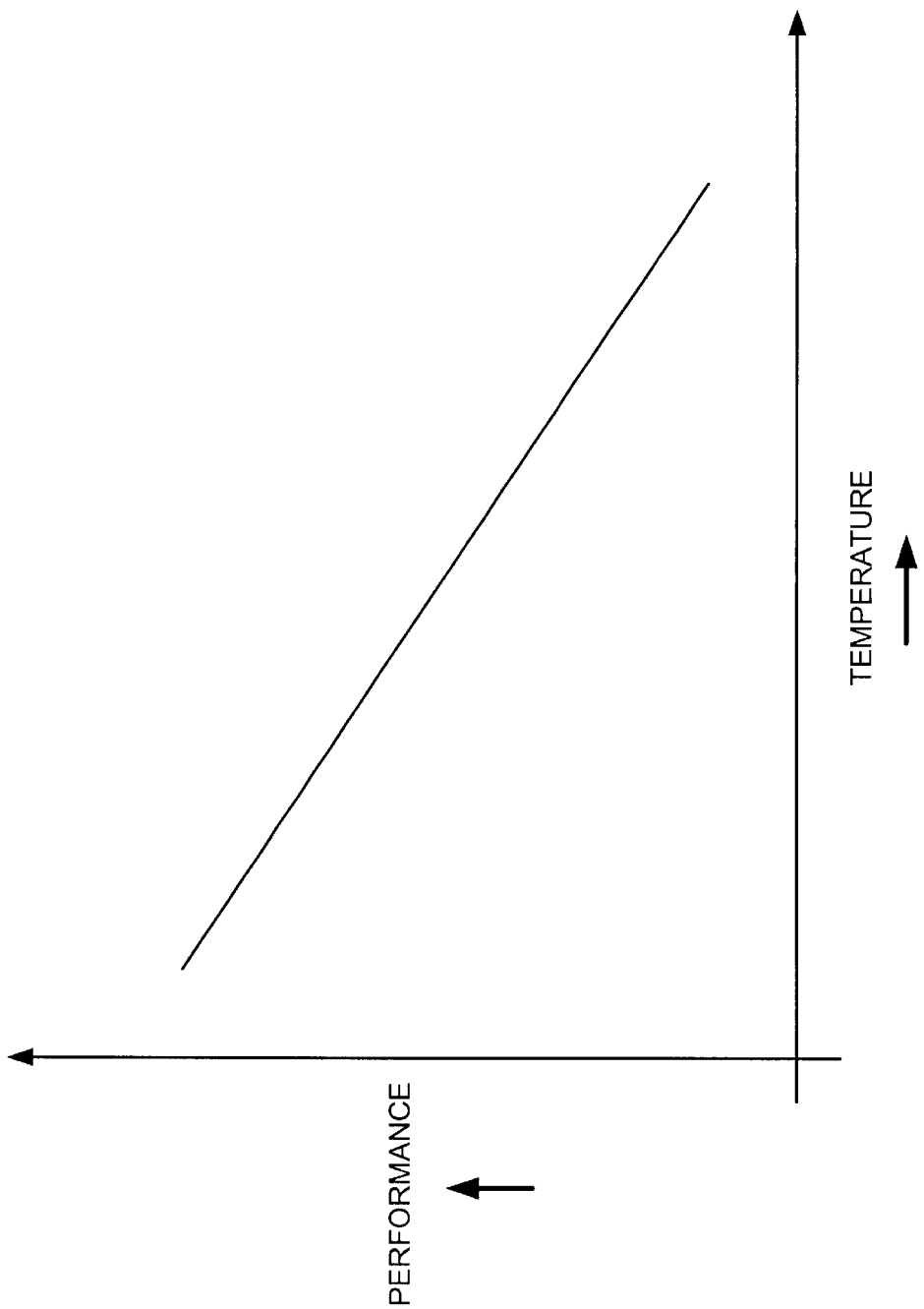
FIG. 11 is a graph illustrating a relationship between performance levels and temperature.

FIG. 11 is a graph that illustrates an exemplary relationship between performance levels and temperature. The graph is merely exemplary in nature and serves to illustrate this relationship. The x-axis represents temperatures or operating temperatures of a semiconductor device and the y-axis represents performance levels. It can be seen from the graph that higher performance levels require lower operating temperatures and that, conversely, lower performance levels permit higher operating temperatures. To determine appropriate acceptable temperature ranges for actual semiconductor devices, a similar graph or relationship is obtained (e.g., by experiment, simulation, mathematical analysis, and the like). A safety factor or threshold can be used so that the desired performance level is actually obtained (e.g., setting the acceptable temperature five percent lower than calculated to leave a safety margin).

It is appreciated that actual relationships between performance levels and temperature are not necessarily linear. Exponential and/or other non-linear relationships can exist and be employed in the present invention.

Figure 12:
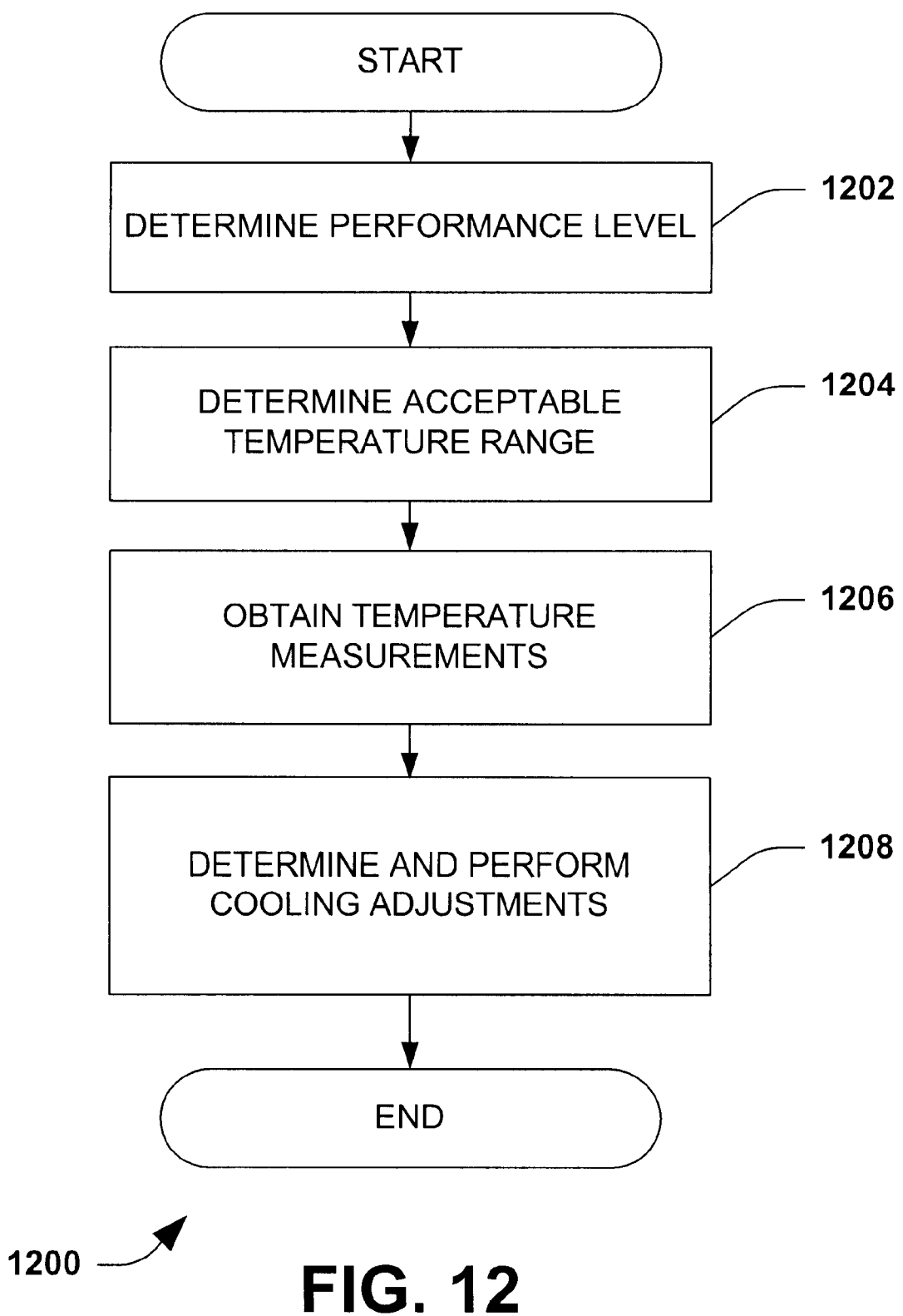
FIG. 12 is a flow diagram illustrating a method of operating an integrated cooler package in accordance with an aspect of the present invention.
Figure 13:
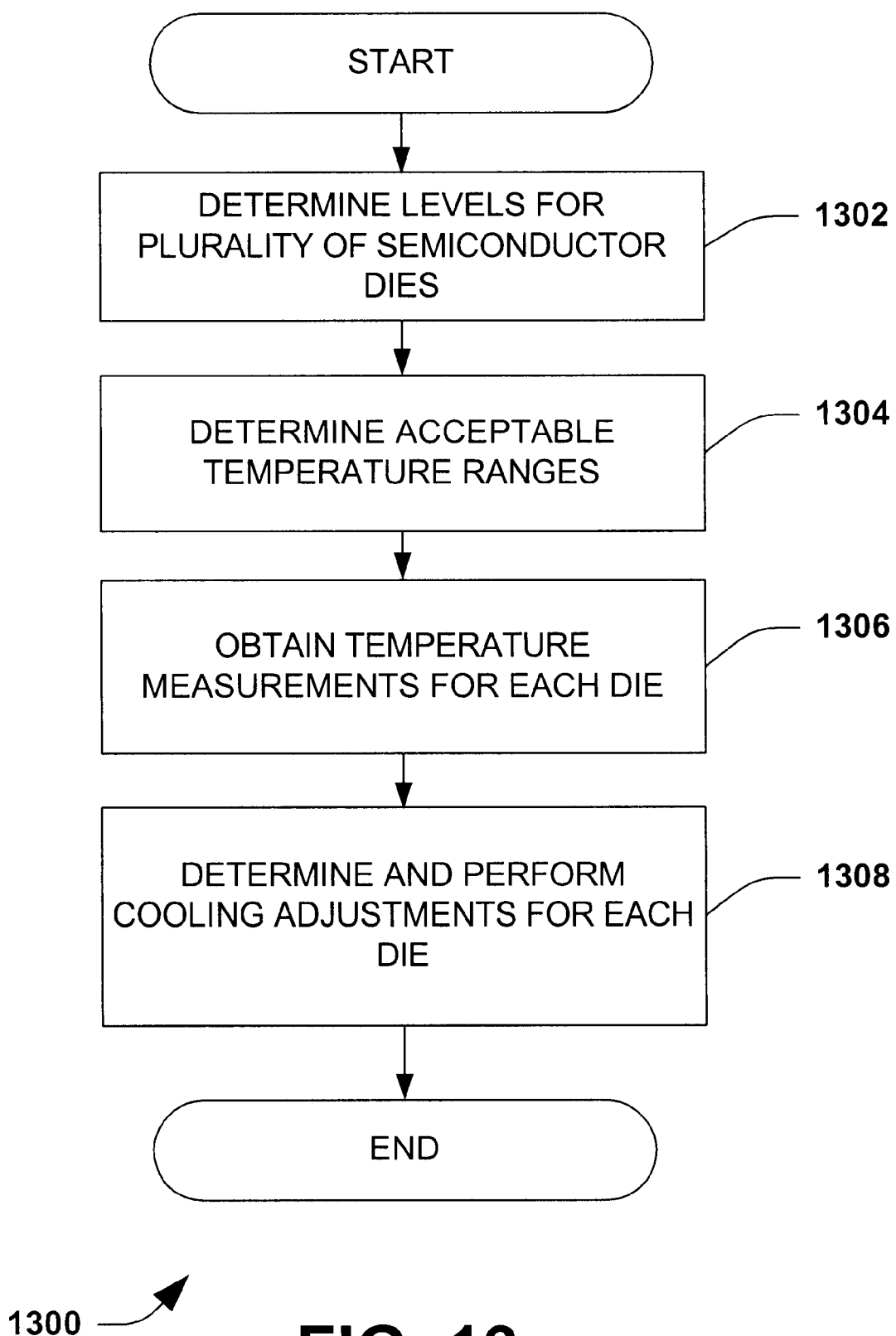
FIG. 13 is a flow diagram illustrating a method of operating a plurality of integrated cooler packages in accordance with an aspect of the present invention.

In view of the foregoing structural and functional features described supra, methodologies in accordance with various aspects of the present invention will be better appreciated with reference to FIGS. 12–13. While, for purposes of simplicity of explanation, the methodologies of FIGS. 12–13 are depicted and described as executing serially, it is to be understood and appreciated that the present invention is not limited by the illustrated order, as some aspects could, in accordance with the present invention, occur in different orders and/or concurrently with other aspects from that depicted and described herein. Moreover not all illustrated features may be required to implement a methodology in accordance with an aspect the present invention.

Turning now to FIG. 12, a flow diagram of a method 1200 of operating an integrated cooler package in accordance with the present invention is illustrated. The cooler package includes a semiconductor die, a thermoelectric cooler, and one or more temperature monitoring devices. The semiconductor die has one or more semiconductor devices formed on it and the thermoelectric cooler is comprised of one or more units or stages. The units can be controlled independently.

The method 1200 begins at 1202 wherein a desired performance level for the semiconductor die is determined. As described supra, the performance level can vary and corresponds to the one or more devices formed on the die. At 1204, an acceptable temperature range is determined according to the semiconductor die, and the devices formed thereon, and the desired performance level. The acceptable temperature range can include a safety factor to further facilitate operation at the desired performance level.

One or more temperature measurements are obtained of the semiconductor die at 1206. These measurements can be summed or averaged to account for erroneous readings. Additionally, the one or more measurements can be specific to one or more regions of the die. Continuing at 1208, cooling adjustments are determined and performed according to the obtained temperature measurements and the acceptable temperature range such that the semiconductor die is cooled according to the one or more temperature measurements and the desired performance level. The cooling is performed by adjusting voltage potentials applied across the units or stages of the thermoelectric cooler. The cooling and applied potentials can vary for the units of the cooler.

It is appreciated that portions of the method 1200 can be performed repeatedly and at varying times. For example, the desired performance level can be dynamically adjusted during operation.

Continuing with FIG. 13, a flow diagram of a method 1300 of operating a plurality of integrated cooler packages in accordance with the present invention is illustrated. The cooler packages respectively include a semiconductor die, a thermoelectric cooler, and one or more temperature monitoring devices. The semiconductor die has one or more semiconductor devices formed on it and the thermoelectric cooler is comprised of one or more units or stages that can be controlled independently.

The method 1300 begins at 1302 wherein desired performance levels for the plurality of semiconductor dies are determined. As described supra, the performance levels can vary and corresponds to the one or more devices formed on the dies. At 1304, acceptable temperature ranges are determined according to the semiconductor dies, and the devices formed thereon, and the desired performance levels. The acceptable temperature ranges can include a safety factor to further facilitate operation at the desired performance level.

One or more temperature measurements are obtained for each of the semiconductor dies at 1306. These measurements can be summed or averaged to account for erroneous readings. Additionally, the one or more measurements can be specific to one or more regions of the die. Based on these measurements, cooling adjustments are determined and performed for each die 1308 according to the obtained temperature measurements and the acceptable temperature ranges. The cooling is performed by adjusting voltage potentials applied across the units or stages of the thermoelectric coolers. The cooling and applied potentials can vary for the units of the cooler.

It is appreciated that portions of the method 1300 can be performed repeatedly and at varying times. For example, the desired performance levels can be dynamically adjusted during operation.

Although invention has been shown and described with respect to a certain aspect or various aspects, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several aspects of the invention, such feature may be combined with one or more other features of the other aspects as may be desired and advantageous for any given or particular application. Furthermore, to the extent that the term "includes" is used in either the detailed description or the claims, such term is intended to be inclusive in a manner similar to the term "comprising."

What is claimed is:

1. An integrated thermoelectric cooling system comprising:
    a semiconductor die;
    a thermoelectric cooler thermally in contact with the semiconductor die;
    a performance monitoring system operable to monitor one or more performance characteristics associated with the semiconductor die;
    one or more temperature monitoring devices that monitor a temperature of the semiconductor die; and
    a controller that dynamically adjusts cooling of the thermoelectric cooler according to the monitored temperature and the one or more performance characteristics.

2. The system of claim 1, wherein the semiconductor die comprises one or more semiconductor devices.

3. The system of claim 2, wherein the semiconductor devices comprise a device selected from the group comprising a processor, a digital to analog/analog to digital converter, an analog to digital converter, an amplifier, and a digital signal processor.

4. The system of claim 1, wherein the semiconductor die has a plurality of regions that generate varied amounts of thermal energy.

5. The system of claim 4, wherein the thermoelectric cooler has a plurality of units that correspond to the plurality of regions of the semiconductor die, wherein the plurality of units provide independently controlled cooling.

6. The system of claim 5, wherein the controller individually adjusts cooling for the plurality of units.

7. The system of claim 6, wherein each of the plurality of regions of the semiconductor die has at least one temperature monitoring device associated with the region.

8. The system of claim 1, further comprising thermal grease that adheres the thermoelectric cooler with the semiconductor die.

9. The system of claim 1, further comprising a substrate on which the semiconductor die is mounted, wherein the substrate includes a number of signal and power lines.

10. The system of claim 9, further comprising thermal balls, power balls, and signal balls formed on a lower side of the substrate that provide external connections to the system.

11. The system of claim 10, further comprising a circuit board on which the substrate is mounted.

12. The system of claim 1, further comprising a heatsink in contact with the thermoelectric cooler.

13. The system of claim 12, wherein a cooling side of the thermoelectric cooler is in contact with the semiconductor die and a heating side of the thermoelectric cooler is in contact with the heatsink.

14. The system of claim 1, wherein the controller and the one or more temperature monitoring devices are formed in or on the semiconductor die.

15. An integrated thermoelectric cooling system comprising:
    a lower substrate;
    a thermoelectric cooler formed on the lower substrate;
    an upper substrate that surrounds the thermoelectric cooler;
    a thermal paste layer formed on the thermoelectric cooler;
    a semiconductor die adhered by the thermal paste to the thermoelectric cooler;
    a performance monitoring system operable to monitor one or more performance characteristics associated with the semiconductor die;
    one or more temperature monitoring devices that monitor a temperature of the semiconductor die; and
    a controller that dynamically adjusts cooling of the thermoelectric cooler according to the monitored temperature and the one or more performance characteristics.

16. The system of claim 15, further comprising a lid that covers and protects the semiconductor die and the thermoelectric cooler.

17. An integrated cooling system comprising:
    a plurality of integrated devices that each comprise:
        a semiconductor die;
        a thermoelectric cooler that has a cooling side in contact with the semiconductor die;
        a performance monitoring system operable to monitor one or more performance characteristics associated with the semiconductor die;
        one or more temperature monitoring devices that measure temperatures associated with the die; and
    a controller that individually controls cooling of each of the plurality of integrated devices according to measured temperatures and the one or more performance characteristics for each device.

18. The system of claim 17, wherein the desired performance level is varied for each device.

19. A method of operating an integrated cooler package having a semiconductor die, a thermoelectric cooler, and one or more temperature monitoring devices, the method comprising:
    monitoring one or more performance characteristics associated with the semiconductor die;
    obtaining one or more temperature measurements; and
    dynamically cooling the semiconductor die by the thermoelectric cooler according to the one or more temperature measurements and the one or more performance characteristics.

20. The method of claim 19, further comprising modifying the desired performance level and the acceptable operating temperature range according to the modified desired performance level.

21. The method of claim 19, wherein dynamically cooling the semiconductor die comprises applying a voltage potential across contacts of the thermoelectric cooler.

22. The method of claim 19, wherein determining the desired performance level comprises determining a desired frequency of operation.

23. The method of claim 19, wherein determining the desired performance level comprises determining a desired signal to noise ratio.

* * * * *